(12) United States Patent
Lee et al.

(10) Patent No.: US 9,005,491 B2
(45) Date of Patent: *Apr. 14, 2015

(54) PHOTOSENSITIVE RESIN COMPOSITION FOR COLOR FILTER AND COLOR FILTER USING THE SAME

(75) Inventors: Chang-Min Lee, Uiwang-si (KR); Yeon-Soo Lee, Uiwang-si (KR); Yong-Hee Kang, Uiwang-si (KR); Man-Suk Kim, Uiwang-si (KR); Taek-Jin Baek, Uiwang-si (KR); Hyun-Moo Choi, Uiwang-si (KR); Kyung-Hee Hyung, Uiwang-si (KR); Sang-Hyun Hong, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/353,710

(22) Filed: Jan. 19, 2012

(65) Prior Publication Data

US 2013/0001483 A1 Jan. 3, 2013

(30) Foreign Application Priority Data

Jun. 29, 2011 (KR) .................. 10-2011-0063964

(51) Int. Cl.
*G02B 5/23* (2006.01)
*G03F 7/033* (2006.01)
(Continued)

(52) U.S. Cl.
CPC *G02B 5/23* (2013.01); *G03F 7/033* (2013.01); *G03F 7/0007* (2013.01)
USPC ....... 252/586; 204/192.15; 430/7; 430/270.1; 430/281.1; 430/285.1; 430/286.1; 522/33; 522/42; 522/46; 522/53; 522/78; 522/79; 522/182; 526/319; 526/320

(58) Field of Classification Search
CPC .......... G02B 5/23; G03F 7/033; G03F 7/032; C08F 2/50; C08F 2/46; C08J 3/28
USPC ............... 204/192.15; 252/586; 430/7, 270.1, 430/281.1, 286.1, 285.1; 522/33, 42, 46, 522/53, 63, 78, 79, 182; 526/319, 320
See application file for complete search history.

(56) References Cited

U.S. PATENT DOCUMENTS 3,030,347 A 4/1962 O'Brien et al.
(Continued)

FOREIGN PATENT DOCUMENTS

CN 1121083 A 4/1996
(Continued)

OTHER PUBLICATIONS

Dennis Price Kelly Pyrah, T. Richard Hull, G. John Milnes, John R. Ebdon,Barry J. Hunt, Paul Joseph, Christopher S. Konkel Flame retarding poly(methyl methacrylate) with phosphoruscontaining compounds: comparison of an additive with a reactive approach, Polymer Degradation and Stability 74 (2001) 441-447,# 2001 Elsevier Science Ltd.*
(Continued)

*Primary Examiner* — Bijan Ahvazi
(74) *Attorney, Agent, or Firm* — Additon, Higgins & Pendleton, P.A.

(57) ABSTRACT

A photosensitive resin composition for a color filter includes (A) an acrylic-based binder resin including a structural unit represented by the following Chemical Formula 1, wherein the definitions of $R^1$, $R^2$, $R^3$ and $R^4$ are the same as set forth in specification; (B) an acrylic-based photopolymerizable monomer; (C) a photopolymerization initiator; (D) a colorant; and (E) a solvent.

[Chemical Formula 1]

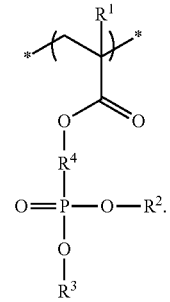

9 Claims, 2 Drawing Sheets (a) (b) (c)

(51) Int. Cl.
*G03C 1/00* (2006.01)
*G03F 7/00* (2006.01)

(56) References Cited

U.S. PATENT DOCUMENTS

| | | | |
|---|---|---|---|
| 3,985,831 A | 10/1976 | Boyer | |
| 4,409,350 A | 10/1983 | Fujiwara et al. | |
| 5,278,009 A | 1/1994 | Iida et al. | |
| 5,292,817 A | 3/1994 | Grey et al. | |
| 5,663,019 A | 9/1997 | Matsumura et al. | |
| 5,773,533 A | 6/1998 | Horold | |
| 5,827,626 A * | 10/1998 | Kobayashi et al. | 430/7 |
| 5,876,895 A | 3/1999 | Hishiro et al. | |
| 5,998,091 A | 12/1999 | Suzuki | |
| 6,096,852 A | 8/2000 | Lensvelt et al. | |
| 6,624,250 B2 | 9/2003 | Zimmerman | |
| 6,632,891 B1 | 10/2003 | Tada et al. | |
| 7,763,402 B2 | 7/2010 | Cho et al. | |
| 7,863,382 B2 | 1/2011 | Ishii et al. | |
| 8,293,149 B2 * | 10/2012 | Lee et al. | 252/586 |
| 8,486,591 B2 | 7/2013 | Jeong et al. | |
| 2002/0115761 A1 | 8/2002 | Eckel et al. | |
| 2002/0172873 A1 | 11/2002 | Ueda et al. | |
| 2007/0145338 A1 | 6/2007 | Zakikhani | |
| 2008/0242795 A1 | 10/2008 | Jang et al. | |
| 2010/0152357 A1 | 6/2010 | Kwon et al. | |
| 2010/0160474 A1 | 6/2010 | Lee et al. | |
| 2010/0240831 A1 | 9/2010 | Kim et al. | |
| 2010/0256288 A1 | 10/2010 | Kim et al. | |
| 2011/0009524 A1 | 1/2011 | Kwon et al. | |
| 2011/0160400 A1 * | 6/2011 | Lee et al. | 525/64 |
| 2013/0001483 A1 | 1/2013 | Lee et al. | |
| 2013/0234084 A1 | 9/2013 | Chung et al. | |

FOREIGN PATENT DOCUMENTS

| | | | |
|---|---|---|---|
| CN | 101464631 A | 6/2009 | |
| CN | 101497630 A | 8/2009 | |
| CN | 101747610 A | 6/2010 | |
| CN | 101805567 A | 8/2010 | |
| EP | 0319971 A2 | 6/1989 | |
| EP | 0628599 A1 | 12/1994 | |
| EP | 0663410 A1 | 7/1995 | |
| EP | 0725315 A2 | 8/1996 | |
| EP | 1739109 A1 | 1/2007 | |
| EP | 2657292 A1 | 10/2013 | |
| JP | 02-70712 A | 3/1990 | |
| JP | 07-140654 A | 6/1995 | |
| JP | 08-262707 A | 10/1996 | |
| JP | 10-254133 A | 9/1998 | |
| JP | 11-092964 A | 4/1999 | |
| JP | 2000-075501 A | 3/2000 | |
| JP | 2000-305262 A | 11/2000 | |
| JP | 2002-244287 A | 8/2002 | |
| JP | 2006-257126 A | 9/2006 | |
| JP | 2008-298938 * | 12/2008 | G03F 7/26 |
| JP | 2009-091458 * | 4/2009 | |
| JP | 2009-091458 A | 4/2009 | |
| KR | 10-1980-001251 B1 | 10/1980 | |
| KR | 10-1992-7002502 | 9/1992 | |
| KR | 10-1993-7000858 | 3/1993 | |
| KR | 10-1994-0005617 | 6/1994 | |
| KR | 10-1995-7000359 | 1/1995 | |
| KR | 10-1995-0011163 B1 | 9/1995 | |
| KR | 10-1995-7003746 | 9/1995 | |
| KR | 10-1996-0029904 | 8/1996 | |
| KR | 10-2001-0052338 A | 6/2001 | |
| KR | 10-2006-0111178 | 10/2006 | |
| KR | 10-0817563 B1 | 3/2008 | |
| KR | 10-0832518 B1 | 5/2008 | |
| KR | 10-2008-0089122 A | 10/2008 | |
| KR | 10-0885819 B1 | 2/2009 | |
| KR | 10-2009-0024561 A | 3/2009 | |
| KR | 10-2009-0038191 A | 4/2009 |
| KR | 10-2009-0066204 A | 6/2009 |
| KR | 10-2009-0066242 A | 6/2009 |
| KR | 10-0910829 B1 | 8/2009 |
| KR | 10-2009-0106226 A | 10/2009 |
| KR | 10-2010-0049458 A | 5/2010 |
| KR | 10-2010-0098882 A | 9/2010 |
| KR | 10-2011-0077881 A | 7/2011 |
| KR | 10-2011-0078238 A | 7/2011 |
| TW | 406214 B | 9/2000 |
| TW | 200916955 A | 4/2009 |
| TW | 201030461 A | 8/2010 |
| WO | 99/58593 A1 | 11/1999 |
| WO | 2008/120854 A1 | 10/2008 |
| WO | 2009/116722 A1 | 9/2009 |
| WO | 2012/015128 A1 | 2/2012 |
| WO | 2012/060514 A1 | 5/2012 |
| WO | 2012/060515 A1 | 5/2012 |
| WO | 2012/081761 A1 | 6/2012 |

OTHER PUBLICATIONS

Benjamin Canniccioni, Sophie Monge, Ghislain David, Jean-Jacques Robin, Polymerization of a Phosphonated Methacrylate via Raft Living Radical Polymerization, Polymer Preprints, American Chemical Society, Division of Polymer Chemistry, 2011, 52(2), 645-646.*

Office Action in commonly owned U.S. Appl. No. 12/966,133 mailed on Jan. 3, 2013, pp. 1-20.

Ebdon et al., "Thermal degradation and flame retardance in copolymers of methyl methacrylate with diethyl (methacryloyloxymethyl)phosphonate", Sep.-Dec. edition of Polymer Degradation and Stability, vol. 70, 2000, pp. 425-436.

UL IDES properties for PMMA, downloaded from http://plastics.ides.com/generics/3/c/t/acrylic-acrylic-properties-processing on Dec. 19, 2012, pp. 1-4.

Office Action in commonly owned U.S. Appl. No. 13/190,979 mailed on Feb. 16, 2012, pp. 1-10.

Notice of Allowance in commonly owned U.S. Appl. No. 13/190,979 mailed on Jun. 19, 2012, pp. 1-10.

Search Report in counterpart Chinese Application No. 201210007804.5 dated Dec. 1, 2013, pp. 1-4.

International Search Report in counterpart International Application No. PCT/KR2010/009539 dated Jan. 18, 2012, pp. 1-6.

Notice of Allowance in commonly owned U.S. Appl. No. 13/872,240 mailed Aug. 20, 2014, pp. 1-9.

International Search Report in commonly owned International Application No. PCT/KR2010/009538 dated Sep. 16, 2011, pp. 1-4.

Price et al., "Ignition temperatures and pyrolysis of a flame-retardant methyl methacrylate copolymer containing diethyl (methacryloyloxymethyl)-phosphonate units", Polymer International, Oct. 5, 2000, vol. 49, pp. 1164-1168.

Chinese Office Action in commonly owned Chinese Application No. 201080070004.7 dated Feb. 19, 2014, pp. 1-7.

English-translation of Chinese Office Action in commonly owned Chinese Application No. 201080070004.7 dated Feb. 19, 2014, pp. 1-7.

Hong et al., "Preparation and Properties of Flame Retardant Acrylate Rubber," China Synthetic Rubber Industry, vol. 23, No. 02, pp. 92-94.

Jin et al., "Polyacrylates Flame Retardants," Chinese Journal of Colloid & polymer, vol. 19, No. 4, pp. 41-43, 2001.

International Search Report in commonly owned International Application No. PCT/KR2010/009533 dated Dec. 19, 2011, pp. 1-2.

Office Action in commonly owned U.S. Appl. No. 13/872,240 mailed Feb. 24, 2014, pp. 1-8.

Office Action in commonly owned U.S. Appl. No. 13/740,335 mailed Sep. 18, 2014, pp. 1-20.

Extended European Search Report in commonly owned European Application No. 10855400 dated Nov. 15, 2013, pp. 1-6.

Office Action in commonly owned U.S. Appl. No. 13/914,856 mailed Oct. 14, 2014, pp. 1-10.

International Search Report in commonly owned International Application No. PCT/KR2010/009532 dated Dec. 19, 2011, pp. 1-2.

(56) References Cited

OTHER PUBLICATIONS

Final Office Action in commonly owned U.S. Appl. No. 12/966,133 mailed on Jun. 28, 2013, pp. 1-23.

Price et al., "Flame retardance of poly(methyl methacrylate) modified with phosphorus-containing compounds", Polymer Degradation and Stability, vol. 77, (2002) pp. 227-233.

* cited by examiner

PHOTOSENSITIVE RESIN COMPOSITION FOR COLOR FILTER AND COLOR FILTER USING THE SAME

CROSS-REFERENCE TO RELATED APPLICATION

This application claims priority under 35 USC Section 119 to and the benefit of Korean Patent Application No. 10-2011-0063964 filed in the Korean Intellectual Property Office on Jun. 29, 2011, the entire disclosure of which is incorporated herein by reference.

FIELD OF THE INVENTION

This disclosure relates to a photosensitive resin composition for a color filter and a color filter using the same.

BACKGROUND OF THE INVENTION

Color filters can be used for liquid crystal displays (LCD), optical filters for cameras, and the like. Color filters can be fabricated by coating a fine region colored with three or more colors on a charge coupled device or a transparent substrate. The colored thin film can be fabricated by dyeing, printing, electrophoretic deposition (EPD), pigment dispersion, and the like.

The color filter is prepared through many chemical treatments during the manufacturing process. Accordingly, in order to maintain a pattern formed under the aforementioned conditions, a color photosensitive resin is required to have a development margin but chemical resistance and thus, to improve yield of a color filter.

A conventional color liquid crystal display (LCD) is generally fabricated by preparing a color filter substrate for displaying a color image separately from an operating substrate on which a thin film transistor (TFT) is disposed and then, binding the color filter substrate and the operating substrate together. However, since there can be low arrangement accuracy during the binding step, conventional color liquid crystal displays can require a shading layer with a large width. Accordingly, it is difficult to increase the aperture ratio (a ratio of an active light-emitting area to a total pixel area). In addition, because the glass substrates of LCDs and LCD screens have recently become larger, it takes longer for a liquid crystal composition to cover the front side of the substrates during vacuum injection of a liquid crystal.

A method has been suggested to sharply decrease the time needed to print a seal material and drip a liquid crystal to form an over-coat. The method, however, can result in sharply deteriorated arrangement accuracy.

A method of forming a color filter on the operating TFT array substrate of a TFT color liquid crystal display (LCD) has also been suggested. Since this method does not need a color filter substrate and fabricates a transparent substrate through sputtering and binding two substrates, it has an advantage of simplifying the arrangement and increasing an aspect rate.

However, when a color filter is formed on a TFT array substrate, a pixel electrode is formed on the color filter in a photolithography method by using a common positive photoresist. Accordingly, the resist layer needs to be removed after forming the electrode. In other words, a pixel electrode is formed by forming a transparent electrode layer on color pixels of a color filter, coating a positive resist composition thereon, and patterning it, exposing it to light, and developing it. Then, the resist layer remaining on the pixel electrode should be peeled and removed with a resist stripper. Accordingly, the positive resist composition requires resistance against the resist stripper. Then, the resist layer remaining on the pixel electrode should be peeled and removed with a resist stripper. Accordingly, the positive resist composition requires resistance against the resist stripper.

Conventionally, a pixel electrode is fabricated by forming a transparent layer (a pixel protective layer) having stripper-resistance on a color filter. In addition, a pixel electrode can be fabricated without coating a pixel protective layer by treating a stripper at a low temperature for a longer time to decrease the stripper's influence on a color filter.

However, these conventional methods have problems of deteriorating yield rate and production efficiency, since they require more processes and longer time. In order to solve these problems, another method has been suggested, which includes using a radiation-sensitive composition with an expansion rate of less than 5% against a stripper to remove a cured layer forming a color layer in a COA (color filter on array) method. Further, a color filter can have improved thermal polymerization cross-linking effects by using a multi-functional alicyclic epoxy compound as a thermal polymerization cross-linking agent and a benzophenone-based peroxide as a thermal polymerization initiator. According to this method, a color filter can be cured at a low temperature for a short time and thereby, can have excellent durability and close contacting (adhesion) properties. However, as the demand increases for larger screens with higher image quality than can be produced using conventional methods, there is also an increased need for a color filter with a higher aperture ratio and higher performance.

SUMMARY OF THE INVENTION

One embodiment provides a photosensitive resin composition for a color filter that can have close contacting (adhesion) properties to a substrate.

Another embodiment provides a color filter using the photosensitive resin composition for a color filter.

According to one embodiment, provided is a photosensitive resin composition for a color filter that includes (A) an acrylic-based binder resin including a structural unit represented by the following Chemical Formula 1; (B) an acrylic-based photopolymerizable monomer; (C) a photopolymerization initiator; (D) a colorant; and (E) a solvent.

[Chemical Formula 1]

In the above Chemical Formula, $R^1$ is hydrogen, C1 to C20 alkyl, C6 to C20 aryl, C7 to C20 alkylaryl, C3 to C20 cycloalkyl, or C5 to C20 multicycloalkyl, $R^2$ and $R^3$ are the same or different and are each independently C1 to C20 alkyl, C6 to C20 aryl, C7 to C20 alkylaryl, C3 to C20 cycloalkyl, or C5 to C20 multicycloalkyl, and $R^4$ is C1 to C20 alkylene, C6 to C20 arylene, C7 to C20 alkylarylene, C3 to C20 cycloalkylene, or C5 to C20 multicycloalkylene.

The acrylic-based binder resin may include the structural unit represented by Chemical Formula 1 in an amount of about 0.05 to about 50 wt % based on the total weight of monomers constituting the acrylic-based binder resin.

The photosensitive resin composition for a color filter may include about 1 to about 50 wt % of the acrylic-based binder resin including the structural unit represented by the above Chemical Formula 1 (A); about 0.5 to about 20 wt % of the acrylic-based photopolymerizable monomer (B); about 0.1 to about 10 wt % of the photopolymerization initiator (C); about 0.1 to about 40 wt % of the colorant (D); and balance of the solvent (E).

The acrylic-based binder resin (A) may have a weight average molecular weight (Mw) of about 1,000 to about 100,000.

The acrylic-based binder resin (A) may have an acid value of about 20 to about 200 mgKOH/g.

The acrylic-based binder resin (A) may further include at least one of the structural units represented by Chemical Formulas 2 to 6, or a combination thereof.

[Chemical Formula 2]

In the above Chemical Formula,
$R^5$ is hydrogen or methyl, and
k is an integer ranging from 1 to 5.

[Chemical Formula 3]

In the above Chemical Formula,
$R^6$ is hydrogen or methyl, and
$R^7$ is hydrogen, hydroxy, carboxyl, halogen, haloalkyl (wherein the alkyl is substituted or unsubstituted C1 to C10 alkyl), substituted or unsubstituted C1 to C20 alkyl, or —CO—$R^8$—COOH (wherein $R^8$ is substituted or unsubstituted C1 to C10 alkylene or substituted or unsubstituted C1 to C10 alkoxylene).

[Chemical Formula 4]

In the above Chemical Formula,
$R^9$ and $R^{10}$ are the same or different and are each independently hydrogen or methyl, and $R^{11}$ is carboxyl, $R^{12}$ is carboxyl or —CONH$R^{13}$ (wherein $R^{13}$ is substituted or unsubstituted C1 to C10 alkyl or substituted or unsubstituted C6 to C20 aryl), or $R^{11}$ and $R^{12}$ are fused with each other to provide a ring.

[Chemical Formula 5]

In the above Chemical Formula,
$R^{14}$ is hydrogen or methyl, and
$R^{15}$ is substituted or unsubstituted C6 to C30 aryl.

[Chemical Formula 6]

In the above Chemical Formula,
$R^{16}$ is hydrogen or methyl, and
$R^{17}$ is substituted or unsubstituted C1 to C20 alkyl, substituted or unsubstituted C6 to C30 aryl, or substituted or unsubstituted C7 to C30 arylalkyl.

When the acrylic-based binder resin (A) includes all of the structural units represented by the following Chemical Formulas 2 to 6 and each mole ratio of the above Chemical Formulas 2 to 6 is m, n, o, p and q, $1 \leq m \leq 80$, $1 \leq n \leq 80$, $1 \leq o \leq 80$, $1 \leq p \leq 80$, and $1 \leq q \leq 80$.

The acrylic-based binder resin (A) may include the structural units represented by the above Chemical Formulas 2 to 6 in an amount of about 0.1 to about 80 wt %, based on the total weight of the acrylic-based binder resin (A).

The photosensitive resin composition may further include one or more additives. Examples of the additives include without limitation dispersing agents; malonic acid; 3-amino-1,2-propanediol; silane-based coupling agents including a vinyl group or a (meth)acryloxy group; leveling agents; fluorine-based surfactants; radical polymerization initiators; and the like, and combinations thereof.

According to another embodiment, a color filter manufactured using the photosensitive resin composition for a color filter is provided.

Hereinafter, embodiments will be described in detail.

The photosensitive resin composition for a color filter according to embodiments may have excellent heat resistance and chemical resistance and thus excellent hole and patterning properties, and accordingly it can be used to form a color filter on a TFT array substrate to provide a high aperture ratio and a high contrast ratio.

BRIEF DESCRIPTION OF THE DRAWINGS

FIGS. 1(a), (b), and (c) are photographs showing films prepared using a photosensitive resin composition for a color filter according to Examples 1, 2, and 3, respectively, after evaluation of stripper resistance.

FIGS. 2(a) and (b) are photographs showing films prepared using a photosensitive resin composition for a color filter according to Comparative Examples 1 and 2, respectively, after evaluation of stripper resistance.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C20 alkyl, the term "aryl" may refer to C6 to C30 aryl, the term "arylalkyl" may refer to C7 to C30 arylalkyl, the term "alkylene group" may refer to C1 to C20 alkylene, and the term "alkoxylene" may refer to a C1 to C20 alkoxylene.

As used herein, when a specific definition is not otherwise provided, the term "substituted" may refer to one substituted with a substituent including halogen (F, Cl, Br, or I), hydroxyl, nitro, cyano, imino (=NH, =NR, wherein R is C1 to C10 alkyl), amino (—NH$_2$, —NH(R'), —N(R")(R'"), wherein R' to R'" are the same or different and are independently C1 to C10 alkyl), amidino, hydrazine, hydrazone, carboxyl, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, in place of at least one hydrogen in a functional group.

As used herein, when a specific definition is not otherwise provided, the term "hetero" may refer to one substituted with at least one atom including N, O, S, P, or a combination thereof.

The photosensitive resin composition for a color filter according to one embodiment includes (A) an acrylic-based binder resin including a structural unit represented by the following Chemical Formula 1; (B) an acrylic-based photopolymerizable monomer; (C) a photopolymerization initiator; (D) a colorant; and (E) a solvent.

[Chemical Formula 1]

In the above Chemical Formula, $R^1$ is hydrogen, C1 to C20 alkyl, C6 to C20 aryl, C7 to C20 alkylaryl, C3 to C20 cycloalkyl or C5 to C20 multicycloalkyl, $R^2$ and $R^3$ are the same or different and are each independently C1 to C20 alkyl, C6 to C20 aryl, C7 to C20 alkylaryl, C3 to C20 cycloalkyl or C5 to C20 multicycloalkyl, and $R^4$ is C1 to C20 alkylene, C6 to C20 arylene, C7 to C20 alkylarylene, C3 to C20 cycloalkylene, or C5 to C20 multicycloalkylene.

The photosensitive resin composition for a color filter may further include one or more other additives (F).

Hereinafter, the components of the photosensitive resin composition for a color filter are illustrated in detail.

(A) Acrylic-Based Binder Resin

The acrylic-based binder resin includes a structural unit represented by the following Chemical Formula 1.

The acrylic-based binder resin may include the structural unit represented by Chemical Formula 1 in an amount of about 0.05 to about 50 wt %, for example about 0.1 to about 30 wt %, based on the total weight of the acrylic-based binder resin. In some embodiments, the acrylic-based binder resin may include the structural unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit represented by Chemical Formula 1 can be in a range from about any of the foregoing amounts to about any other of the foregoing amounts.

When acrylic-based binder resin includes the structural unit represented by Chemical Formula 1 in an amount within the above range, the acrylic-based binder resin may have excellent close contacting (adhesion) and developing properties with a substrate.

[Chemical Formula 1]

wherein, in the above Chemical Formula, $R^1$ is hydrogen, C1 to C20 alkyl, C6 to C20 aryl, C7 to C20 alkylaryl, C3 to C20 cycloalkyl or C5 to C20 multicycloalkyl, $R^2$ and $R^3$ are the same or different and are each independently C1 to C20 alkyl, C6 to C20 aryl, C7 to C20 alkylaryl, C3 to C20 cycloalkyl or C5 to C20 multicycloalkyl, and $R^4$ is C1 to C20 alkylene, C6 to C20 arylene, C7 to C20 alkylarylene, C3 to C20 cycloalkylene, or C5 to C20 multicycloalkylene.

The acrylic-based binder resin may be a copolymer including the structural unit of the above Chemical Formula 1 and further including structural units derived from an ethylenic unsaturated monomer including at least one carboxyl group and optionally an ethylenic unsaturated monomer capable of being copolymerized therewith.

Examples of the ethylenic unsaturated monomer including a carboxyl group may include without limitation acrylic acid, methacrylic acid, maleic acid, itaconic acid, fumaric acid, and the like, and combinations thereof.

Examples of the ethylenic unsaturated monomer capable of being copolymerized with the ethylenic unsaturated monomer including at least one carboxyl group may include without limitation alkenyl aromatic compounds such as styrene, α-methyl styrene, vinyl toluene, vinyl benzyl methyl ether, and the like; unsaturated carbonic acid ester compounds such as methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like; unsaturated carbonic acid amino alkyl ester compounds such as 2-amino ethyl acrylate, N-phenylmaleimide, glycolmethacrylate, polyvalerolactone methacrylate, N-vinylpyrrolidinone, 2-amino ethyl methacrylate, 2-dimethyl amino ethyl acrylate, 2-dimethyl amino ethyl methacrylate, and the like; carbonic acid vinyl ester compounds such as vinyl acetate, vinyl benzoate, and the like; unsaturated carbonic acid glycidyl ester compounds such as glycidyl acrylate, glycidyl methacrylate, and the like; vinyl cyanide compounds such as acrylonitrile, methacrylonitrile, and the like; unsaturated amide compounds such as acrylamide, methacrylamide; and the like; and combinations thereof.

The acrylic-based binder resin may include the first ethylenic unsaturated monomer in an amount of about 1 to about 50 wt %, for example about 3 to about 40 wt %, and as another example about 5 to about 30 wt %, based on the total weight of the acrylic-based binder resin. In some embodiments, the acrylic-based binder resin may include the first ethylenic unsaturated monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

In addition, a photosensitive resin composition for a color filter according to the present invention may include one or more acrylic-based copolymers including at least one repeating unit selected from the following Chemical Formulas 2 to 6, or a combination thereof, as well as a structural unit of the above Chemical Formula 1 to provide excellent heat resistance and chemical resistance and to provide a fine pattern for a color filter.

[Chemical Formula 2]

In the above Chemical Formula,
$R^5$ is hydrogen or methyl, and
k is an integer ranging from 1 to 5.

[Chemical Formula 3]

In the above Chemical Formula,
$R^6$ is hydrogen or methyl, and
$R^7$ is hydrogen, hydroxy, carboxyl, halogen, haloalkyl (wherein the alkyl is substituted or unsubstituted C1 to C10 alkyl), substituted or unsubstituted C1 to C20 alkyl or —CO—$R^8$—COOH (wherein $R^8$ is substituted or unsubstituted C1 to C10 alkylene or substituted or unsubstituted C1 to C10 alkoxylene).

[Chemical Formula 4]

In the above Chemical Formula,
$R^9$ and $R^{10}$ are the same or different and are each independently hydrogen or methyl,
$R^{11}$ is carboxyl, $R^{12}$ is carboxyl or —CONHR$^{13}$ (wherein $R^{13}$ is substituted or unsubstituted C1 to C10 alkyl or substituted or unsubstituted C6 to C20 aryl), or $R^{11}$ and $R^{12}$ are fused with each other to provide a ring, for example, $R^{11}$ and $R^{12}$ are fused with each other to provide a ring such as cyclic acid anhydride or cyclic moiety of pyrrolidine-2,5 dione.

[Chemical Formula 5]

In the above Chemical Formula,
$R^{14}$ is hydrogen or methyl, and
$R^{15}$ is substituted or unsubstituted C6 to C30 aryl.

[Chemical Formula 6]

In the above Chemical Formula,
$R^{16}$ is hydrogen or methyl, and
$R^{17}$ is substituted or unsubstituted C1 to C20 alkyl, substituted or unsubstituted C6 to C30 aryl, or substituted or unsubstituted C7 to C30 arylalkyl.

When the acrylic-based binder resin (A) includes all of the structural units represented by the following Chemical Formulas 2 to 6 and each mole ratio of the above Chemical Formulas 2 to 6 is m, n, o, p and q, 1≤m≤80, 1≤n≤80, 1≤o≤80, 1≤p≤80, and 1≤q≤80.

The acrylic-based binder resin (A) may include a structural unit represented by the above Chemical Formulas 2 to 6, or a combination thereof, in an amount of about 0.1 wt % to about 80 wt % based on the total weight of the acrylic-based binder resin. In some embodiments, the acrylic-based binder resin may include a structural unit represented by Chemical Formulas 2 to 6 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of a structural unit represented by Chemical Formulas 2 to 6 can be in a range from about any of the foregoing amounts to about any other of the foregoing amounts.

When the acrylic-based binder resin (A) includes a structural unit selected from the above Chemical Formulas 2 to 6 in an amount within the above range, the acrylic-based binder resin may have excellent chemical resistance and chemical resistance and pattern stability and may not deteriorate light transmission characteristic.

The acrylic-based binder resin (A) including at least one structural unit including an aliphatic hydrocarbon group at a side chain end (a branched chain) and represented by Chemical Formulas 2 to 6 has a structure similar to a photoreactive functional group included in an acrylic-based photopolymerizable monomer and may be photopolymerized and cross-linked by a radical induced by the photopolymerization initiator that will be described hereinafter.

The cross-linking ratio of the acrylic-based binder resin (A) may vary depending on a ratio of an acrylic-based photopolymerizable monomer and a photopolymerization initiator that will be described hereinafter and accordingly, the cross-linking ratio of the acrylic-based binder resin (A) may be regulated by controlling a ratio of an acrylic-based photopolymerizable monomer and a photopolymerization initiator The acrylic-based binder resin (A) may have a weight average molecular weight of about 1,000 to about 100,000, for example about 5,000 to about 50,000. The acrylic-based binder resin (A) may have an acid value of about 20 to about 200 mgKOH/g, for example about 50 to about 180 mgKOH/g. When the acrylic-based binder resin (A) has a weight average molecular weight and an acid value within the above ranges, the photosensitive resin composition may have excellent developability.

The photosensitive resin composition may include the acrylic-based binder resin (A) in an amount of about 1 to about 50 wt % based on the total weight of the photosensitive resin composition for a color filter. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the acrylic-based binder resin can be in a range from about any of the foregoing amounts to about any other of the foregoing amounts.

When the photosensitive resin composition includes the acrylic-based binder resin (A) in an amount within the above range, the composition may have excellent developability in an alkali solution, have less surface roughness due to good cross-linking, and have no pattern peeling due to good chemical resistance.

(B) Acrylic-Based Photopolymerizable Monomer

Examples of the acrylic-based photopolymerizable monomer (B) may include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenolA diacrylate, trimethylolpropane triacrylate, novolacepoxy acrylate, ethyleneglycol dimethacrylate, diethyleneglycol dimethacrylate, triethyleneglycol dimethacrylate, propyleneglycol dimethacrylate, 1,4-butanediol dimethacrylate, 1,6-hexanediol dimethacrylate, and the like, and combinations thereof.

The photosensitive resin composition may include the acrylic-based photopolymerizable monomer (B) in an amount of about 0.5 to about 20 wt %, based on the total weight of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based photopolymerizable monomer can be in a range from about any of the foregoing amounts to about any other of the foregoing amounts.

When the photosensitive resin composition includes the acrylic-based photopolymerizable monomer in an amount within the above range, a pattern may have a neat edge and good developability in an alkali developing solution.

(C) Photopolymerization Initiator

Examples of the photopolymerization initiator (C) may include without limitation triazine-based compounds, acetophenone-based compounds, benzophenone-based compounds, thioxanthone-based compounds, benzoin-based compounds, oxime-based compounds, and the like, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxy styryl)-4, 6-bis(trichloromethyl)-s-triazine, 2-(4'-methoxy naphthyl)-4,6-bis(trichloromethyl)-s-triazine, 2-(p-methoxy phenyl)-4, 6-bis(trichloromethyl)-s-triazine, 2-(p-tolyl)-4,6-bis (trichloro methyl)-s-triazine, 2-biphenyl-4,6-bis(trichloro methyl)-s-triazine, 2,4-bis(trichloro methyl)-6-styryl-s-triazine, 2-(naphto-1-yl)-4,6-bis(trichloro methyl)-s-triazine, 2-(4-methoxy naphto-1-yl)-4,6-bis(trichloro methyl)-s-triazine, 2,4-bis(trichloro methyl)-6-piperonyl-s-triazine, 2,4-bis (trichloro methyl)-6(4'-methoxy styryl)-s-triazine, and the like, and combinations thereof.

Examples of the acetophenone-based compound may include without limitation 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, and combinations thereof.

The benzophenone-based compound may include benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyl dimethyl ketal, and the like, and combinations thereof.

Examples of the oxime-based compound may include without limitation 2-(o-benzoyloxime)-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may further include a carbazole-based compound, a diketone-based compound, a sulfonium borate-based compound, a diazo-based compound, a biimidazole-based compound, and the like, or a combination thereof.

The photosensitive resin composition may include the photopolymerization initiator in an amount of about 0.1 to about 10 wt %, based on the total weight of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photosensitive resin composition includes the photopolymerization initiator in an amount within the above range, the composition may be sufficiently photopolymerized when exposed during the pattern-forming process and may exhibit minimal or no transmittance deterioration due to non-reacted initiator left after the photopolymerization.

(D) Colorant

Examples of the colorant (D) include without limitation pigments, dyes, and the like, and combinations thereof. When the pigment and dye are used together, luminance and pattern formation capability can be improved.

The pigment can include red, green, blue, yellow, and violet colors. Examples of the pigment may include without limitation anthraquinone-based pigments, condensed polycyclic pigments such as perylene-based pigments and the like, phthalocyanine pigments, azo-based pigments, and the like. They are used as singularly or in combination of two or more. In one embodiment, a combination of two or more pigments can be used to adjust maximum absorption wavelength, cross point, crosstalk, and the like.

The pigment may be included in a photosensitive resin composition for a color filter as a pigment dispersion solution.

In addition, the pigment may include a dispersing agent, so that the pigment component can be uniformly dispersed. Examples of the dispersing agent may include without limitation nonionic, anionic, cationic dispersing agents, and combinations thereof. Examples of the dispersing agents include without limitation polyalkylene glycols and esters thereof, polyoxyalkylenes, polyhydric alcohol ester alkylene oxide additives, alcohol alkyleneoxide additives, sulfonic acid esters, sulfonic acid salts, carboxylic acid esters, carboxylic acid salts, alkylamidealkyleneoxide additives, alkylamines, and the like. These dispersing agents can be used singularly or in a combination of two or more.

In addition, a carboxyl-containing acrylic-based resin as well as the dispersing agent can be added to the pigment in order to improve pixel patterning properties as well as stability of a pigment dispersion solution.

The pigment can have a primary particle diameter ranging from about 5 to about 80 nm, for example a primary particle diameter ranging from about 10 to about 70 nm. When the pigment has a primary particle diameter within the above range, it can have excellent stability in a dispersion solution but may not deteriorate resolution of pixels.

Examples of the dye may include without limitation anthraquinone-based compounds, cyanine-based compounds, merocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinidine-based compounds, methine-based compounds, quinoline-based compounds, and the like, and combinations thereof.

When the colorant includes a mixture of a pigment and a dye, the pigment and the dye may be mixed at a weight ratio ranging from about 1:9 to about 9:1 based on the total weight of the colorant.

In some embodiments, the mixture of a pigment and a dye may include the pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the pigment can be in a range from about any of the foregoing amounts to about any other of the foregoing amounts.

In some embodiments, the mixture of a pigment and a dye may include the dye in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the dye can be in a range from about any of the foregoing amounts to about any other of the foregoing amounts.

When a colorant is prepared to include a mixture of a pigment and a dye in an amount within the above range, the composition may exhibit high luminance and contrast ratio and desired color characteristics.

The photosensitive resin composition may include the colorant (D) in an amount of about 0.1 to about 40 wt %, based on the total weight of the photosensitive resin composition for a color filter. In some embodiments, the photosensitive resin composition may include the colorant in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the photosensitive resin composition includes the colorant (D) in an amount within the above range, the composition may have appropriate coloring effects and developability.

(E) Solvent

The solvent (E) has compatibility with the acrylic-based binder resin and other constituting component materials, but does not react therewith.

Examples of the solvent (E) may include without limitation ethylene glycol acetate, ethyl cellosolve, ethyl ethoxy propionate, ethyl lactate, polyethyleneglycol, and the like, and combinations thereof. The solvent may include ethylene glycol-based compounds such as ethylene glycol, diethylene glycol, and the like; glycol ether-based compounds such as ethylene glycol monomethylether, diethylene glycol monomethylether, ethylene glycol diethylether, diethylene glycol dimethylether, and the like; glycol ether acetate-based compounds such as ethylene glycol monoethylether acetate, diethylene glycol monoethylether acetate, diethylene glycol monobutylether acetate, and the like; propylene glycols such as propylene glycol and the like; propylene glycol ether-based compounds such as propylene glycol monomethylether, propylene glycol monoethylether, propylene glycol monopropylether, propylene glycol monobutylether, propylene glycol dimethylether, dipropyleneglycol dimethylether, propyleneglycol diethylether, dipropyleneglycol diethylether, and the like; propylene glycol ether acetate-based compounds such as propyleneglycol monomethylether acetate, dipropylene glycol monoethylether acetate, and the like; amide-based compounds such as N-methyl pyrrolidone, dimethyl formamide, dimethyl acetamide, and the like; ketone-based compounds such as methyl ethyl ketone (MEK), methyl isobutyl ketone (MIBK), cyclohexanone, and the like; petroleum-based compounds such as toluene, xylene, solvent naphtha, and the like; and ester-based compounds such as ethyl acetate, butyl acetate, ethyl lactate, and the like. These compounds may be used singularly or in a mixture of two or more.

The solvent (E) may be used in a balance amount, for example, in an amount of about 20 to about 90 wt %, based on the total weight of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is used in an amount within the above range, the photosensitive resin composition may have excellent coating properties and maintain flatness when the composition is coated as a 1 μm-thick or thicker film.

(F) Other Additive(s)

The photosensitive resin composition for a color filter according to the present invention may further include one or more additives. For example, the photosensitive resin composition for a color filter can include a dispersing agent as described above other than the (A) to (E) components, so that the colorant (D) such as a pigment may be uniformly dispersed in a solvent (E).

In addition, the photosensitive resin composition may include one or more other additives such as malonic acid; 3-amino-1,2-propanediol; a silane-based coupling agent having a vinyl group or (meth)acryloxyl group; a leveling agent; a fluorine-based surfactant; a radical polymerization initiator, and the like, and combinations thereof to prevent a spot or a stain during the coating and a residue due to leveling characteristic or non-development. The amount of these additives may be readily determined by the skilled artisan without undue experimentation, and the amounts may vary depending on the desired composition properties.

Examples of the silane-based coupling agent may include without limitation vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof. The photosensitive resin composition may include the silane-based coupling agent in an amount of about 0.01 wt % to about 2 wt %, based on the total weight of the resin composition. When the photosensitive resin composition includes the silane-based coupling agent in an amount within the above range, adherence, storage stability and coating properties may be improved.

Examples of the fluorine-based surfactant may include a surfactant having a fluorocarbon chain. Examples of the fluorine-based surfactant may include without limitation FULORAD FC430, and FULORAD FC431 (SUMITOMO 3M CO., LTD.); MEGAFACE F142D, MEGAFACE F171, MEGAFACE F172, MEGAFACE F173, MEGAFACE F177, MEGAFACE F183, MEGAFACE F470, MEGAFACE F475, and MEGAFACE R30 (DAINIPPON INK KAGAKU KOGYO CO., LTD. (DIC)); EFTOP EF301, EFTOP EF303, EFTOP EF351, and EFTOP EF352 (Shin Akita Kasei Kabushiki Kaisha); SURFLON S381, SURFLON S382, SURFLON SC101, and SURFLON SC105 (ASAHI GLASS CO., LTD.); E5844 (Daikin Finechemical Laboratory); and the like, and combinations thereof.

A color filter according to another embodiment may be manufactured using the photosensitive resin composition for a color filter.

Hereinafter, a method of manufacturing a color filter using the photosensitive resin composition for a color filter is described in detail.

The photosensitive resin composition for a color filter may be coated to a thickness of about 3.1 to about 3.4 μm on a bare glass substrate or a glass substrate with an about 500 to about 1500 Å-thick SiNx layer (a protective layer) using any appropriate method such as spinning, slit coating, and the like. The coated substrate can be exposed to radiation (is irradiated with light) to form a pattern required for a color filter. After the radiation, the coated layer can be treated with an alkali developing solution to dissolve the non-exposed part and form a pattern for a color filter. These processes can be repeated as many times as necessary depending on the number of R, G, and B colors required to form a color filter with a desired pattern. In addition, this image pattern may be cured by heating or exposing to radiation (radiating with an active ray) to further improve crack resistance, solvent resistance, and the like.

In general, since a negative photosensitive resin is not easily stripped by an organic solvent, its residue may contaminate a lower layer. In addition, since the negative photosensitive resin is more weakly adhered to a lower layer than a positive photosensitive resin, it may have a bigger under-cut. However, a photosensitive resin composition for a color filter according to the present invention may improve resistance of the negative photosensitive resin against a stripper and thus, prevent contamination of a lower layer and also, improve adherence to the lower layer.

Hereinafter, Examples and Comparative Examples are illustrated to explain the present invention in more detail. However, the following exemplary embodiments should be understood not to limit but explain the present invention.

Synthesis Examples 1 to 5

Synthesis of Acrylic-Based Binder Resin 2,2'-azobis(2,4-dimethylvalero nitrile) (an initiator) in an amount sufficient to provide 10 wt % thereof based on the total weight of monomers, and monomers in a weight ratio set forth in Table 1 are added to a flask with a cooler and an agitator, and 200 parts by weight of propyleneglycol monomethyletheracetate (PGMEA) (a solvent) are added thereto based on 100 parts by weight of the sum of the initiator and the monomers. The mixture is slowly agitated under a nitrogen atmosphere. Then, the reaction solution is heated up to 75° C. and agitated for 8 hours, polymerizing an acrylic-based binder resin including aliphatic hydrocarbon. The acrylic-based binder resin has a solid content of 30 wt % and a weight average molecular weight as provided in Table 1. The weight average molecular weight is a polystyrene-reduced weight average molecular weight measured using GPC (Gel Permeation Chromatography).

TABLE 1

|  | Synthesis Example1 | Synthesis Example2 | Synthesis Example3 | Synthesis Example4 | Synthesis Example5 |
|---|---|---|---|---|---|
| Methacrylic acid | 18 | 18 | 18 | 18 | 15 |
| Isobornylmethacrylate | 12 | 12 | 12 | 12 | 12 |
| Benzyl methacrylate | 35 | 45 | 50 | 55 | 58 |
| Monomethacryloxyl-methylphosPhate diethylester | 20 | 10 | 5 | 0 | 0 |
| Dicyclopentanyl methacrylate | 15 | 15 | 15 | 15 | 15 |
| Mw | 13,000 | 13,500 | 13,500 | 13,500 | 12,500 |
| Acid value (mgKOH/g) | 128 | 125 | 130 | 129 | 105 |

Preparation of Photosensitive Resin Composition for Color Filter

Examples 1 to 3

The following components are used to prepare a photosensitive resin composition as follows. First, a photopolymerization initiator is dissolved in a solvent. The solution is agitated at room temperature for 2 hours. Next, each polymerized acrylic-based copolymer according to Synthesis Examples 1 to 3 and an acrylic-based photopolymerizable monomer are added to the solution. The mixture is agitated at a room temperature for 2 hours. Then, a pigment dispersion solution is added to the agitated mixture. The resulting mixture is agitated at room temperature for one hour, preparing a photosensitive resin composition for a color filter according to the present invention. The solution is filtrated three times to remove impurities.

Comparative Examples 1 to 2

A photosensitive resin composition for a color filter is prepared according to the same method as Examples 1 to 3 except for using the acrylic copolymer synthesized according to Synthesis Examples 4 to 5.

TABLE 2

| Composition | Amount[g] |
|---|---|
| (A) acrylic-based binder resin (polymerized copolymer of Synthesis Examples 1 to 5) | 6.5 |
| (B) acrylic-based photopolymerizable monomer | |
| dipentaerythritol hexaacrylate(DPHA) | 4.5 |
| (C) photopolymerization initiator | |
| IGACURE OXE02(Ciba Specialty Chemicals) | 0.2 |
| (D) pigment dispersion | 46.8 |
| BT-CF (Ciba Specialty Chemicals, red pigment) | 6.2 |
| 2RP-CF(Ciba Specialty Chemicals, yellow pigment) | 2.8 |
| BYK21208 (BYK, dispersing agent) | 2.4 |
| acrylic-based binder resin of (A) | 5.4 |
| PGMEA (solvent) | 30.0 |
| (E) solvent | |
| PGMEA | 28.0 |
| ethylethoxy propionate | 13.9 |
| (F) additive | |
| F-475 (DIC, fluorine-based surfactant) | 0.1 |

Evaluation of Stripper Resistance

The photosensitive resin compositions according to Examples 1 to 3 and Comparative Examples 1 to 2 are used to evaluate resistance of a stripper.

The photosensitive resin compositions according to Examples 1 to 3 and Comparative Examples 1 to 2, respectively, are coated to a thickness of 3 μm on a transparent circular glass substrate (a bare glass) using a spin-coater (K-Spin8, KDNS Co. Ltd.). The coated substrate is soft-baked on a 80° C. hot-plate for 150 seconds, exposed to a light with 60 mJ of output (power) using an exposer (I10C, Nikon Inc.), developed at 25° C. for 60 seconds, and then, washed for 60 seconds and spin-dried for 25 seconds. Herein, the development is performed by using a potassium hydroxide aqueous solution with 1 wt % concentration. Then, the developed substrate is hard-baked for 30 minutes in a 230° C. oven and dipped in a 70° C. stripper (PRS-2000, J. T. Baker) for 40 minutes.

The photosensitive resin composition strip is examined for peeling using an optical microscope. The results are provided in FIGS. 1 and 2.

FIG. 1(a), (b), and (c) are sequentially the results of Examples 1, 2 and 3.

FIGS. 2(a) and (b) are sequentially the results of Comparative Examples 1 and 2.

Figure 1:
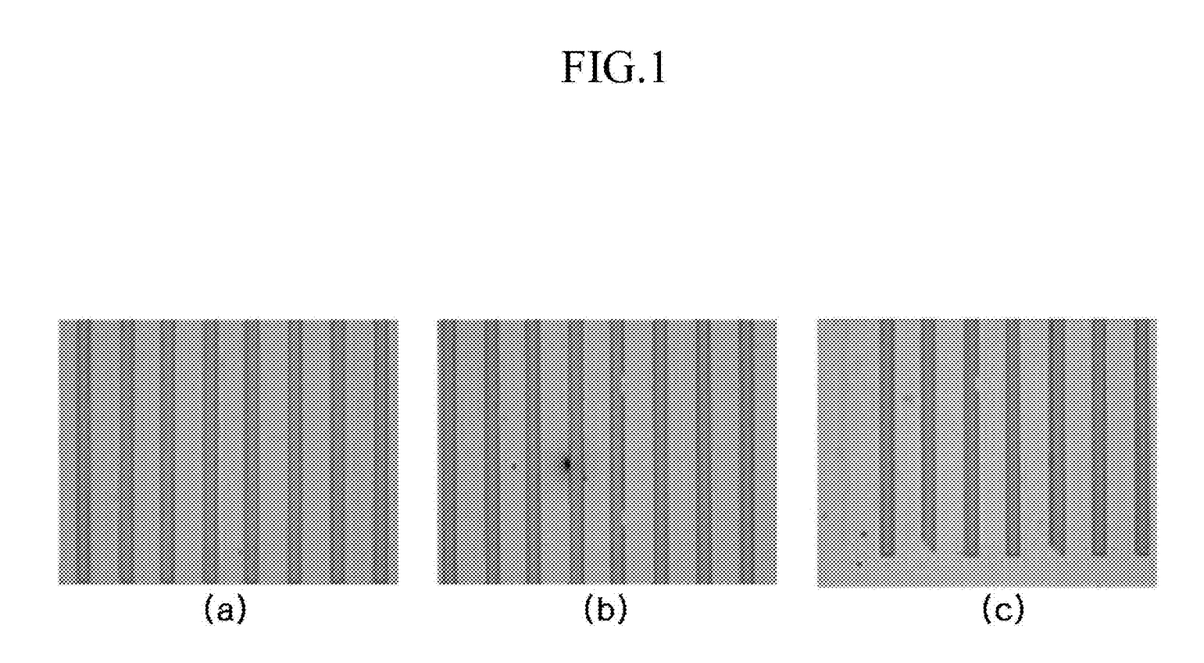
Figure 2:
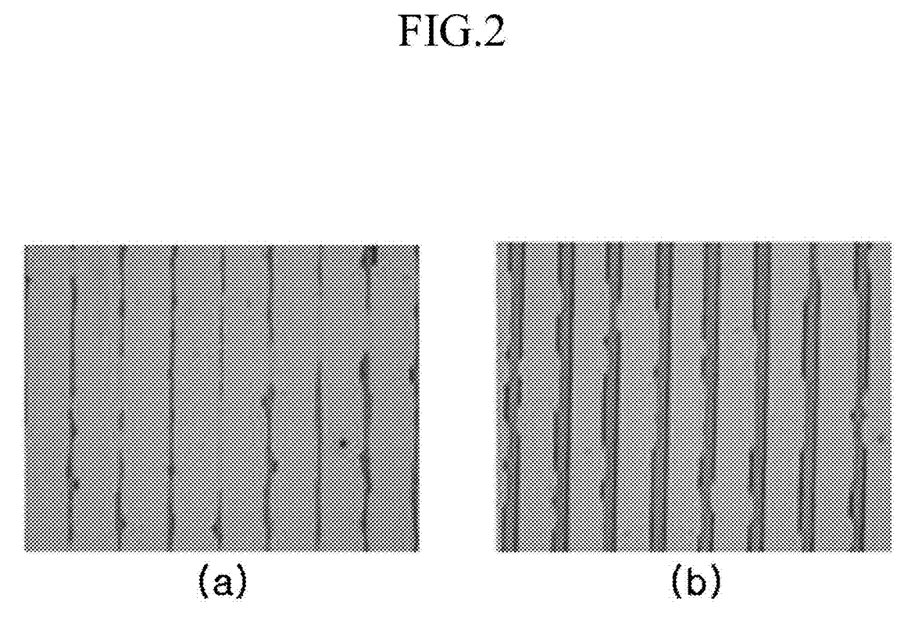

Based on the results of FIG. 1, a pattern is delaminated in Examples 1 to 3 of the present invention as the amount of monomethacryloxylmethylphosphate diethylester with a structure of Chemical Formula 1 decreases. In FIG. 2, a pattern of Comparative Example 1 is mostly delaminated. However, a pattern of Comparative Example 2 having a low acid value is more severely delaminated than the patterns of Examples 1 to 3 having a high acid value but including monomethacryloxylmethylphosphate diethylester with a structure of Chemical Formula 1. Accordingly, a photosensitive resin composition according to the present invention can have excellent close contacting (adhesion) property on a glass substrate.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
   (A) an acrylic-based binder resin including a structural unit represented by the following Chemical Formula 1;
   (B) an acrylic-based photopolymerizable monomer;
   (C) a photopolymerization initiator;
   (D) a colorant; and
   (E) a solvent:

[Chemical Formula 1]

wherein, in the above Chemical Formula,
$R^1$ is hydrogen, C1 to C20 alkyl, C6 to C20 aryl, C7 to C20 alkylaryl, C3 to C20 cycloalkyl or C5 to C20 multicycloalkyl,
$R^2$ and $R^3$ are the same or different and are each independently C1 to C20 alkyl, C6 to C20 aryl, C7 to C20 alkylaryl, C3 to C20 cycloalkyl or C5 to C20 multicycloalkyl, and
$R^4$ is C1 to C20 alkylene, C6 to C20 arylene, C7 to C20 alkylarylene, C3 to C20 cycloalkylene, or C5 to C20 multicycloalkylene, and wherein the acrylic-based binder resin (A) has an acid value of about 20 to about 200 mgKOH/g.

2. The photosensitive resin composition for a color filter of claim 1, wherein the acrylic-based binder resin includes a structural unit represented by Chemical Formula 1 in an amount of about 0.05 to about 50 wt. %, based on total weight of monomers constituting the acrylic-based binder resin.

3. The photosensitive resin composition for a color filter of claim 1, comprising:
about 1 to about 50 wt. % of the acrylic-based binder resin including the structural unit represented by the above Chemical Formula 1 (A);
about 0.5 to about 20 wt. % of the acrylic-based photopolymerizable monomer (B);
about 0.1 to about 10 wt. % of the photopolymerization initiator (C);
about 0.1 to about 40 wt. % of the colorant (D); and
a balance of the solvent (E).

4. The photosensitive resin composition for a color filter of claim 1, wherein the acrylic-based binder resin (A) has a weight average molecular weight (Mw) of about 1,000 to about 100,000.

5. The photosensitive resin composition for a color filter of claim 1, wherein the acrylic-based binder resin (A) further comprises at least one of the structural units represented by Chemical Formulas 2 to 6, or a combination thereof:

[Chemical Formula 2]

wherein, in the above Chemical Formula,
$R^5$ is hydrogen or methyl, and
k is an integer ranging from 1 to 5,

[Chemical Formula 3]

wherein, in the above Chemical Formula,
$R^6$ is hydrogen or methyl, and
$R^7$ is hydrogen, hydroxy, carboxyl, halogen, haloalkyl wherein the alkyl is substituted or unsubstituted C1 to C10 alkyl, substituted or unsubstituted C1 to C20 alkyl or —CO—$R^8$—COOH wherein $R^8$ is substituted or unsubstituted C1 to C10 alkylene, or substituted or unsubstituted C1 to C10 alkoxylene,

[Chemical Formula 4]

wherein, in the above Chemical Formula,
$R^9$ and $R^{10}$ are the same or different and are each independently hydrogen or methyl, and
$R^{11}$ is carboxyl, $R^{12}$ is carboxyl or —CONHR$^{13}$ wherein $R^{13}$ is substituted or unsubstituted C1 to C10 alkyl or substituted or unsubstituted C6 to C20 aryl, or $R^{11}$ and $R^{12}$ are fused with each other to provide a ring,

[Chemical Formula 5]

wherein, in the above Chemical Formula,
$R^{14}$ is hydrogen or methyl, and
$R^{15}$ is substituted or unsubstituted C6 to C30 aryl,

[Chemical Formula 6]

wherein, in the above Chemical Formula,
$R^{16}$ is hydrogen or methyl, and
$R^{17}$ is substituted or unsubstituted C1 to C20 alkyl, substituted or unsubstituted C6 to C30 aryl, or substituted or unsubstituted C7 to C30 arylalkyl.

6. The photosensitive resin composition for a color filter of claim 5, wherein when the acrylic-based binder resin (A) comprises all of the structural units represented by the following Chemical Formulas 2 to 6 and each mole ratio of the above Chemical Formulas 2 to 6 is m, n, o, p and q, 1≤m≤80, 1≤n≤80, 1≤o≤80, 1≤p≤80, and 1≤q≤80.

7. The photosensitive resin composition for a color filter of claim 1, wherein the acrylic-based binder resin (A) includes structural units represented by the above Chemical Formulas 2 to 6 in an amount of about 0.1 to about 80 wt. %, based on the total weight of the acrylic-based binder resin (A).

8. The photosensitive resin composition for a color filter of claim 1, wherein the photosensitive resin composition further comprises an additive comprising a dispersing agent; malonic acid; 3-amino-1,2-propanediol; a silane-based coupling agent including a vinyl group or a (meth)acryloxy group; a leveling agent; a fluorine-based surfactant; a radical polymerization initiator; or a combination thereof.

9. A color filter manufactured using the photosensitive resin composition for a color filter according to claim 1.

* * * * *